(12) United States Patent
Giles et al.

(10) Patent No.: US 7,833,886 B2
(45) Date of Patent: Nov. 16, 2010

(54) METHOD OF PRODUCING A SEMICONDUCTOR ELEMENT IN A SUBSTRATE

(75) Inventors: Luis-Felipe Giles, Munich (DE); Matthias Goldbach, Dresden (DE); Martin Bartels, Dresden (DE); Paul Kuepper, Glonn (DE)

(73) Assignees: Infineon Technologies AG, Neubibery (DE); Qimonda AG, Munich (DE)

( * ) Notice: Subject to any disclaimer, the term of this patent is extended or adjusted under 35 U.S.C. 154(b) by 560 days.

(21) Appl. No.: 11/748,327

(22) Filed: May 14, 2007

(65) Prior Publication Data

US 2008/0286908 A1    Nov. 20, 2008

(51) Int. Cl.
*H01L 21/04* (2006.01)
(52) U.S. Cl. .................................. 438/510; 257/E21.4
(58) Field of Classification Search ................ 438/510, 438/526, 530, 166, 175, 527, 142, 514, 522, 438/532, 305, 306; 257/E21.4, 60
See application file for complete search history.

(56) References Cited

U.S. PATENT DOCUMENTS

| 5,374,564 | A | 12/1994 | Bruel | |
|---|---|---|---|---|
| 2001/0041432 | A1* | 11/2001 | Lee | 438/530 |
| 2002/0016049 | A1* | 2/2002 | Curello et al. | 438/514 |
| 2007/0161219 | A1* | 7/2007 | Giles | 438/530 |
| 2008/0149929 | A1 | 6/2008 | Giles | |

FOREIGN PATENT DOCUMENTS

DE    10 2005 054 218 A1    5/2007

OTHER PUBLICATIONS

S.Saito, "Defect reduction by MeV ion implantation for shallow junction formation", Applied Physics Letters, vol. 63, pp. 197-199.*
Clark, M.R., et al., "Effects of amorphizing species' ion mass on the end-of-range damage formation in silicon," Applied Physics Letters, vol. 80, No. 22, Jun. 3, 2002, pp. 4163-4165.
Duffy, R., et al., "Boron uphill diffusion during ultrashallow junction formation," Applied Physics Letters, vol. 82, No. 21, May 26, 2003, pp. 3647-3649.
Duffy, R., et al., "Boron diffusion in amorphous silicon and the role of fluorine," Applied Physics Letters, vol. 84, No. 21, May 24, 2004, pp. 4283-4285.
Cowern, N.E.B., et al., "Physics-Based Diffusion Simulations for Preamorphized Ultrashallow Junctions," Material Reseach Society Symposium Proceedings, vol. 675, 2003, 6 pages.

(Continued)

*Primary Examiner*—Davienne Monbleau
*Assistant Examiner*—Shweta Mulcare
(74) *Attorney, Agent, or Firm*—Slater & Matsil, L.L.P.

(57) ABSTRACT

A method of producing a semiconductor element in a substrate includes forming a plurality of micro-cavities in a substrate, creating an amorphization of the substrate to form crystallographic defects and a doping of the substrate with doping atoms, depositing an amorphous layer on top of the substrate, and annealing the substrate, such that at least a part of the crystallographic defects is eliminated using the micro-cavities. The semiconductor element is formed using the doping atoms.

44 Claims, 17 Drawing Sheets

OTHER PUBLICATIONS

Scholz, R., et al., "Void formation at the interface of bonded hydrogen-terminated (100) silicon wafers," Microscopy of Semiconducting Materials, Oxford, 1999, 4 pages.

Mannino, G., et al., "Electrical activation of B in the presence of boron-interstitials clusters," American Institute of Physics, Applied Physics Letters, vol. 79. No. 23, Dec. 3, 2001, pp. 3764-3766.

Colombeau, B., et al., "Electrical Deactivation and Diffusion of Boron in Preamorphized Ultrashallow Junctions: Interstitial Transport and F co-implant Control," IEEE, 2004, 4 pages.

Lerch, W., et al., "Advanced Activation of Ultra-shallow Junctions using flash-assisted RTP," European Material Research Society, Symposium D on Materials Science and Device Issues for Future Si-Based Technologies, Paper Reference D-11.02, 2005, pp. 1-22.

Surdeanu, R., et al., "Advanced PMOS Device Architecture for Highly-Doped Ultra-Shallow Junctions," Japanese Journal of Applied Physics, vol. 43, No. 4B, 2004, pp. 1778-1783.

Tyagi, S., et al., "An advanced low power, high performance, strained channel 65nm technology," IEEE International Electron Devices Meeting, IEDM Technical Digest, 2005, pp. 245-247.

Shao, L., et al., "Athermal annealing at room temperature and enhanced activation of low-energy boron implants with high-energy Si coimplantation," American Institute of Physics, Journal of Applied Physics, vol. 92, No. 8, Oct. 15, 2002, pp. 4307-4311.

Kim, J-S., et al., "Atomistic Modeing for Understanding the Suppression of Boron Diffusion in Ge Pre-amorphized Silicon Substrate," Nanoscale Engineering and Fabrication, Micro-and Nano-Engineering, 2006, 2 pages.

Giles, L.F., et al., "Coarsening of End-of-Range defects in ion-implanted silicon annealed in neutral and oxidizing ambients," Nuclear Instruments and Methods in Physics Research B 148, 1999, pp. 273-278.

Colombeau, B., et al., "Depth dependence of defect evolution and TED during annealing," Nuclear Instruments and Methods in Physics Research B 216, 2004, pp. 90-94.

Cristiano, F., et al., "Formation energies and relative stability of perfect and faulted dislocation loops in silicon," American Institute of Physics, Journal of Applied Physics, vol. 87, No. 12, Jun. 15, 2000, pp. 8420-8428.

Duffy, R., et al., "Boron uphill diffusion during ultrashallow junction formation," American Institute of Physics, Applied Physics Letters, vol. 82, No. 21, May 26, 2003, pp. 3647-3649.

Cowern, N.E.B., et al., "Physics-Based Diffusion Simulations for Preamorphized Ultrashallow Junctions," Material Research Society, 2003, 6 pages.

Clark, M.H., et al., "Effects of amorphizing species' ion mass in the end-of-range damage formation in silicon," American Institute of Physics, Applied Physics Letters, vol. 80, No. 22, Jun. 3, 2002, pp. 4163-4165.

Duffy, R., et al., "Boron diffusion in amorphous silicon and the role of fluorine," American Institute of Physics, Applied Physics Letters, vol. 84, No. 21, May 24, 2004, pp. 4283-4285.

Giles, L.F., et al., "Transient enhanced diffusion of B at low temperatures under extrinsic conditions," Solid-State Electronics 49, 2005, pp. 618-627.

Cowern, N.E.B., et al., "Understanding, Modeling and Optimizing Vacancy Engineering for Stable Highly Boron-Doped Ultrashallow Junctions," IEDM Technical Digest, IEEE International Electron Devices Meeting, 2005, 3 pages.

* cited by examiner

METHOD OF PRODUCING A SEMICONDUCTOR ELEMENT IN A SUBSTRATE

BACKGROUND

The invention relates to a method of producing a semiconductor element.

BRIEF DESCRIPTION OF THE DRAWINGS

Various embodiments of the present invention will be explained below in more detail with reference to the accompanying figures, wherein.

DETAILED DESCRIPTION OF ILLUSTRATIVE EMBODIMENTS

With reference to the accompanying FIGS. 1 to 13d, embodiments relating to the method of producing a semiconductor element in a substrate will be depicted in detail below.

Figure 1:
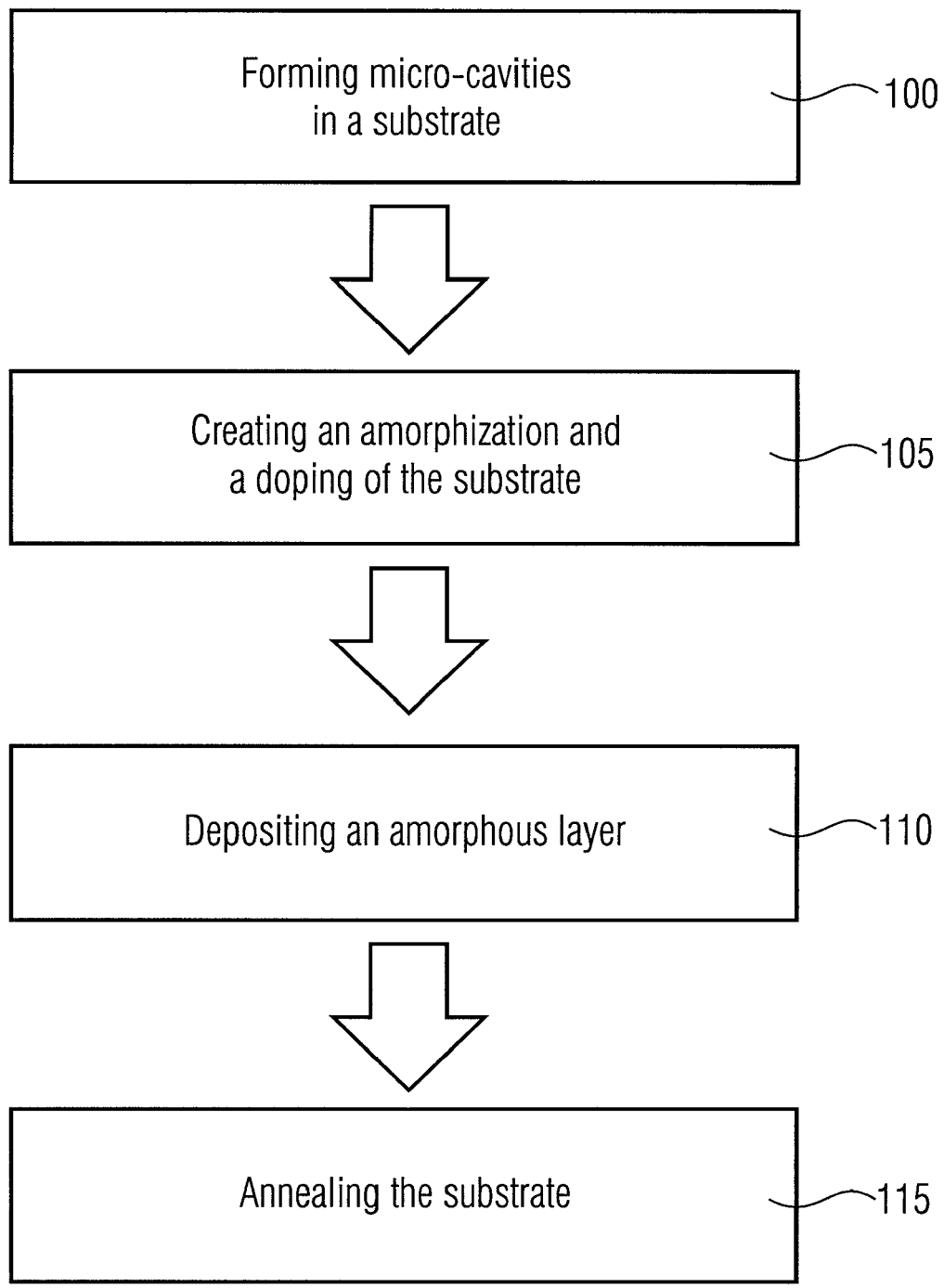
FIG. 1 shows a flow chart of a method of producing a semiconductor element in a substrate by means of depositing an amorphous layer.

With reference to FIG. 1, a detailed explanation of the method of producing a semiconductor element in a substrate is given in the flow chart. This method of producing a semiconductor element in a substrate comprises forming a plurality of micro-cavities in the substrate 100, creating an amorphization of the substrate to form crystallographic defects and a doping of the substrate with doping atoms 105, depositing an amorphous layer on top of the substrate 110, annealing the substrate 115, such that at least a part of the crystallographic defects is eliminated using the micro-cavities and wherein the semiconductor element is formed using the doping atoms.

The micro-cavities in the substrate can be formed in different ways. For example, the forming can be done by implanting ions in the substrate. For example, by implanting hydrogen atoms with a dose higher than $10^{16}\,cm^{-2}$ in a silicon substrate micro-cavities are formed therein. Instead of hydrogen ($H_2^+$-) ions, other ions, like helium ($He^+$-) ions, fluorine ($F^+$-) ions, neon ($Ne^+$-) ions, chlorine ($Cl^+$-) ions or argon ($Ar^+$-) ions can be used.

Implanting ions in the substrate is an easy and reliable mechanism to form the micro-cavities. The micro-cavities in the substrate may comprise, for example, in all three dimensions a size in the micrometer range. The extension of the micro-cavities can, for example, be in one or two dimensions in a micrometer range, and in the third dimension in the nanometer range. However, the micro-cavities can also comprise an extension in the nanometer range in all three dimensions.

The micro-cavities in the substrate may act as sinks for crystallographic defects created during doping and amorphizing the substrate.

The micro-cavities formed in the crystal lattice of the substrate are temperature-stable even by applying a high temperature step higher than 1000° C. after forming the micro-cavities.

Furthermore, the micro-cavities can reduce the transient enhance diffusion (TED) of the implanted doping atoms, which is usually caused by the self-interstitial supersaturation associated with the crystallographic defects.

Creating an amorphization of the substrate to form crystallographic defects and a doping of the substrate with doping atoms 105 can comprise the use of amorphization ions for pre-amorphization of the substrate followed, for example, by low energy p-typed dopant implantation. The amorphization of the substrate and the doping of the substrate may comprise implanting boron atoms, phosphorus atoms or arsenic atoms in the substrate. The implanting of boron atoms may comprise the introduction of boron ions into the substrate, introducing boron fluoride ($BF_2$) or introducing boron clusters ($B_xH_y$).

Creating an amorphization of the substrate to form crystallographic defects can either be done by using amorphization ions for a pre-amorphization of the substrate followed by a doping with doping atoms or by a doping of the substrate with doping atoms, which, apart from the doping, can also cause an amorphization of the substrate. As doping atoms, for example, boron atoms, phosphorus atoms or arsenic atoms can be used.

The creating of the amorphization and the forming of the micro-cavities is performed such that the micro-cavities are formed near the interface between a crystalline region of the substrate and an amorphous region of the substrate formed by the amorphization of the substrate. Therefore, the amorphization is performed such that a buried crystallographic defect layer near the region of the plurality of the micro-cavities is formed.

By means of implanting the amorphization ions, for example, germanium ($Ge^+$-) ions, in the crystalline region of the substrate, crystallographic defects will be generated. So-called interstitials are formed close to the interface between the amorphous region and the crystalline region, which may cause a deactivation of doping atoms and can give rise to a transient enhanced diffusion (TED) in the substrate. Due to their location, close to the interface between the amorphous region and the crystalline region of the substrate, the interstitials are also called "end-of-range" defects (EOR).

Both the dopant deactivation and TED are caused by a self-interstitial super saturation produced by the implantation process itself.

In the context of this application, the term "self-interstitial" refers to a specific type of a one-dimensional point defect in a crystal lattice. In particular, a self-interstitial is meant to be an atom lodged in a position between normal lattice atoms, that is an interstice. The term "self" indicates that the interstitial atom is of the same type as the normal lattice atoms. For example, in a silicon substrate, a self-interstitial would refer to a silicon atom sitting at an interstitial. In the following description, the terms "self-interstitial", "interstitial" and "interstitial-type defects" are used interchangeably.

For producing a semiconductor element, neither the deactivation of the doping atoms, for example, boron atoms, nor the transient enhanced diffusion is desirable. The doping deactivation at low temperatures occurs due to the formation of immobile dopant interstitial clusters. The source of interstitials required for the formation of dopant interstitial clusters has to be seen in the end-of-range damage located close to the original interface between the amorphous region and the crystalline region of the substrate.

One way to eliminate both phenomenon mentioned above, i.e., transient enhanced diffusion and dopant deactivation, is to completely suppress the source of interstitials. In order to reduce TED and dopant deactivation, an implantation as boron fluoride, carbon and fluorine in conjunction with, for example, a germanium pre-amorphization is done. Since both fluorine and carbon are known to diffuse through interstitial type mechanisms, the coupling of fluorine or carbon within interstitials may help to reduce the overall self-interstitial super saturation responsible for TED. However, the above-mentioned implantation approach is not able to completely suppress TED, because it does not completely eliminate the source of the problem, which, in fact, is the excess interstitials located at the crystalline/amorphous interface.

Depositing an amorphous layer on top of the substrate 110 can be performed at a temperature lower than 500° C., for example, at 450° C. As an amorphous layer silicon may be deposited on top of the substrate, for example, in a thickness between 5 nm and 100 nm. The purpose of the thin amorphous layer may be to protect the doping atom concentration close to the surface of the substrate.

Close to the interface between two different substrate materials or between substrate and air, for example, between crystalline silicon and amorphous silicon, or between amorphous silicon and air, or between crystalline silicon and air, or between silicon and silicon dioxide a change in the doping profile may occur. For example, during a temperature step, an enrichment or a segregation of doping atoms close to the interface can be observed.

The annealing, respectively the heating of the substrate 115 is performed in order to re-crystallize at least a part of the amorphized region within the scope of the solid-phase epitaxial regrowth (SPER). By means of the SPER at least a part of the interstitials can be annealed. However, normally there are still some interstitials respectively end-of-range defects left at the border between the amorphous region and the crystalline region of the substrate. Nevertheless, in the inventive method, the end-of-range defects can be reduced or eliminated by the implanted micro-cavities. The annealing within the scope of the SPER process can be performed, for example, at a temperature lower than 650° C. or lower than 580° C. Annealing the substrate may be performed such that the amorphous layer, being deposited before, is also re-crystallized.

Figure 2:
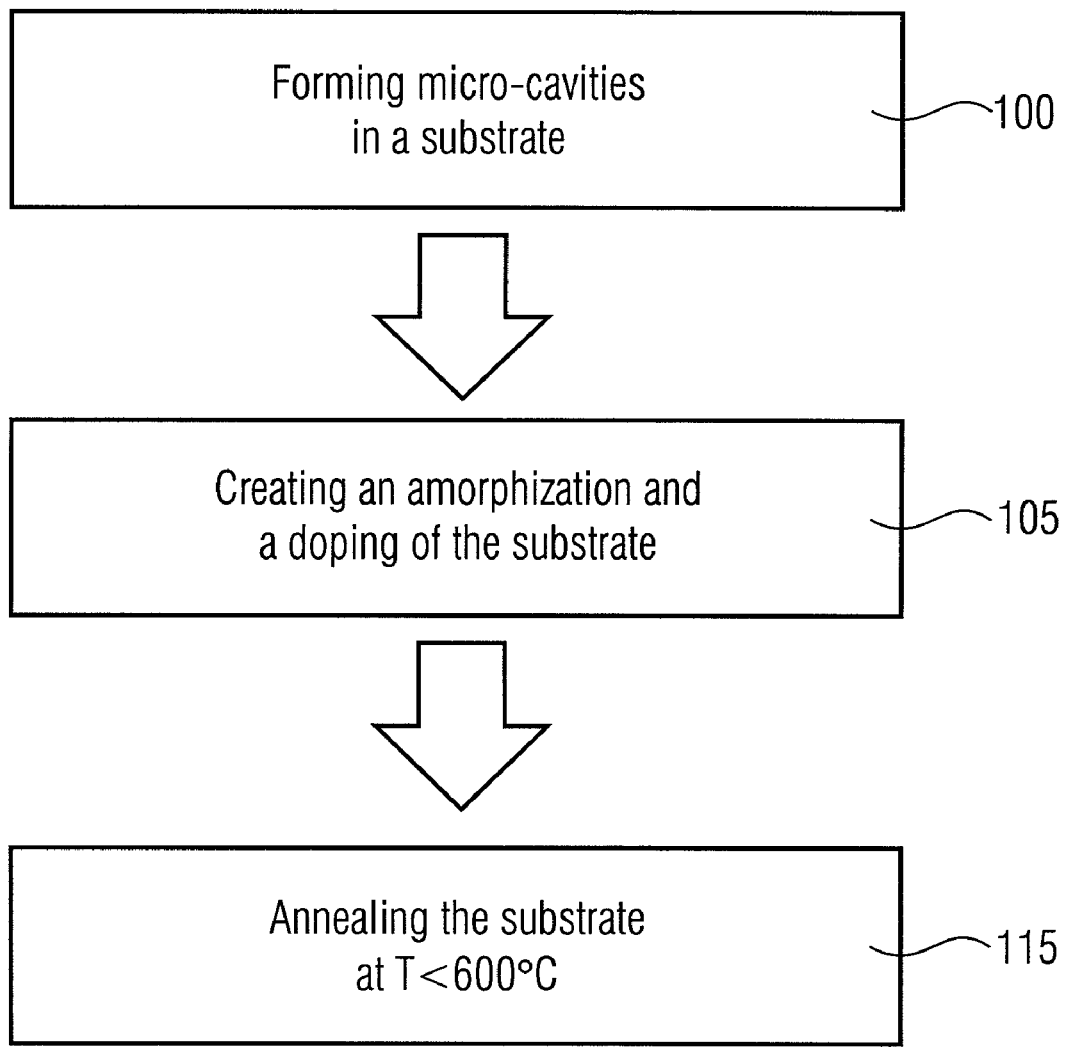
FIG. 2 shows a flow chart of a method of producing a semiconductor element in a substrate by annealing the substrate at a temperature lower than 600° C.

FIG. 2 shows a flow chart in accordance with another embodiment of the invention, again comprising forming micro-cavities in a substrate 100, creating an amorphization and a doping of the substrate 105 and annealing the substrate 115 at a temperature lower than 600° C. In this embodiment, a substrate, for example, a silicon substrate, has been pre-amorphized using germanium ions as implantation ions followed by an implantation of doping atoms, for example, by means of introducing boron ions or introducing boron fluoride ions into the substrate 105 without depositing an amorphous layer on top of the substrate and the annealing respectively the SPER of the substrate 115 is performed at a temperature lower than 600° C. The optimized SPER at low temperatures (T<600° C.) or, for example, also at T<580° C. enables the re-crystallization of the amorphous region of the substrate without significant doping atom loss. This optimized SPER process is needed to ensure that the as-implanted doping atom profile, for example, boron profile, remains immobile.

The micro-cavities formed in the substrate 100 act as sinks for the interstitials, which is why uphill diffusion during the low temperature processing and also during further sample processing is suppressed, wherein the doping profile of the doping atoms may remain almost as-implanted. This shows that the uphill diffusion to the substrate surface is not inherent to the SPER process and that it is possible under certain conditions to almost completely suppress it. The physical process leading to uphill diffusion is the migration of self-interstitials from the end-of-range (EOR) defect region to the surface. Since boron diffuses mainly by pairing with self-interstitials, a large flux of interstitials to the surface will enable the boron atoms located at the tail of the concentration to diffuse against the gradient of boron concentration. The technological importance of suppressing uphill diffusion and as a direct consequence boron loss, is quite high, since it eliminates an element of instability to the process, which is particularly important when technology transfer is considered.

Figure 3:
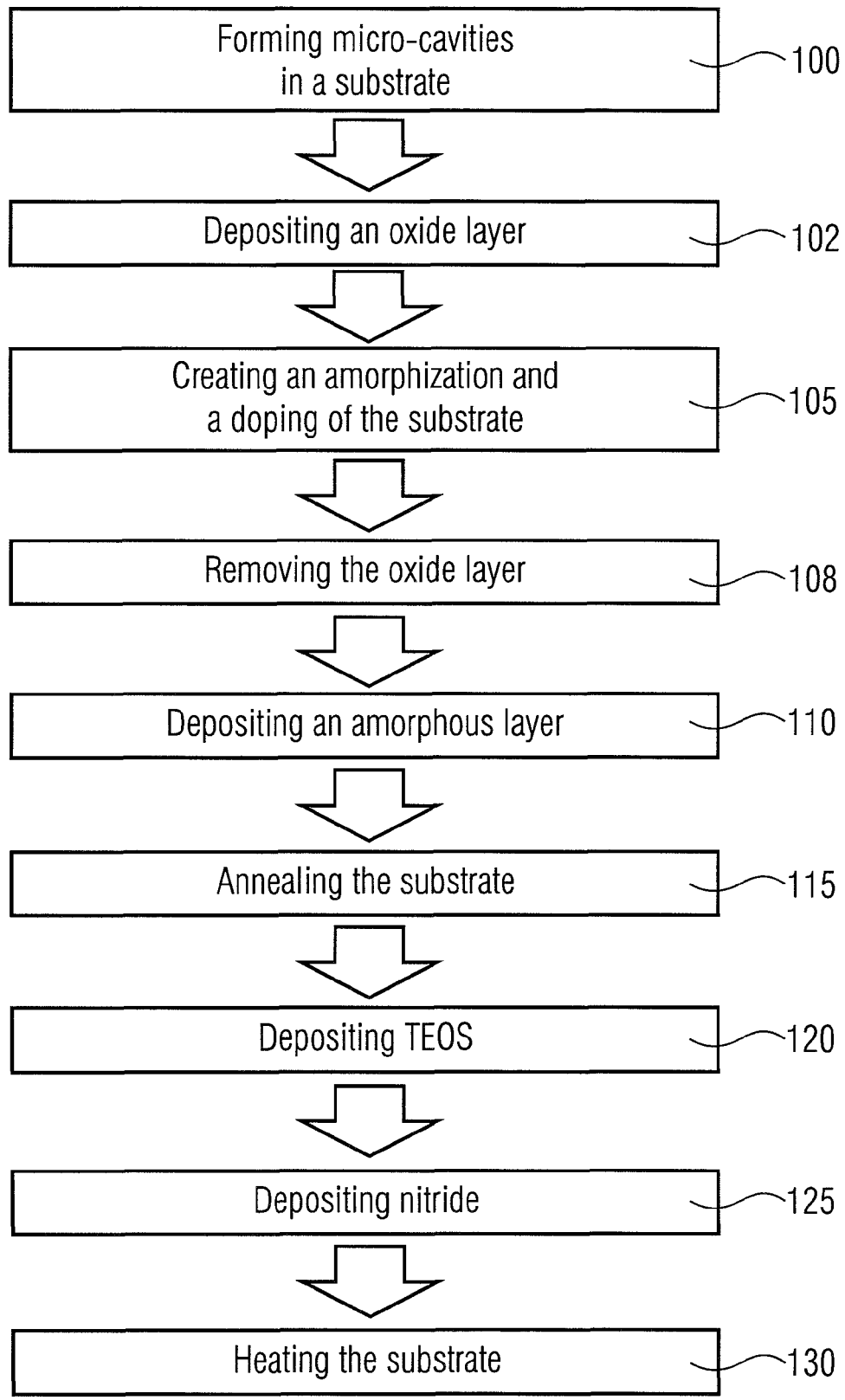
FIG. 3 shows a flow chart of another embodiment of a method of producing a semiconductor element in a substrate.

FIG. 3 shows another embodiment of the inventive method of producing a semiconductor element in a substrate. This figure comprises further possible processes for the method of producing a semiconductor element in a substrate. After forming micro-cavities in a substrate as explained above, an oxide layer 102 may be deposited on top of the substrate, which acts as a screen oxide in order to reach a certain scattering of the atoms in the subsequent implantation steps and, therefore, a reduction of the channeling. Depositing a screen oxide layer can already take place before forming the micro-cavities in the substrate. By using, for example, a 10 nm thick screen oxide an $H_2^+$-ion implantation with an implantation energy of E=10 keV and an implantation dose $\Phi=10^{16} H_2/cm^2$ can reach a depth of approximately 100 nm. In accordance with another embodiment of the invention, the oxide layer could also act as an additional mask in order to limit the lateral extension of the micro-cavity region and/or the amorphization/doping zone in the substrate.

After creating an amorphization and a doping of the substrate 105, the above-mentioned deposited oxide layer or mask can be removed 108 by means of conventional means.

As depicted in FIG. 1 an amorphous layer can be deposited on top of the substrate with the aim to protect the doping atom concentration close to the surface of the semiconductor element. As described above, annealing the substrate 115 is carried out in order to enable a re-crystallization, being amorphized before, by a solid-phase epitaxial regrowth (SPER). Producing a semiconductor element in a substrate may comprise further process steps, for example, depositing tetra-ethyl-ortho-silicate (TEOS) 120 and depositing nitride 125 for a nitride spacer construction. Furthermore, the production of a semiconductor element can comprise another heating process of the substrate 130, for example, a rapid thermal process (RTP), a laser annealing or a flash annealing.

Figure 4:
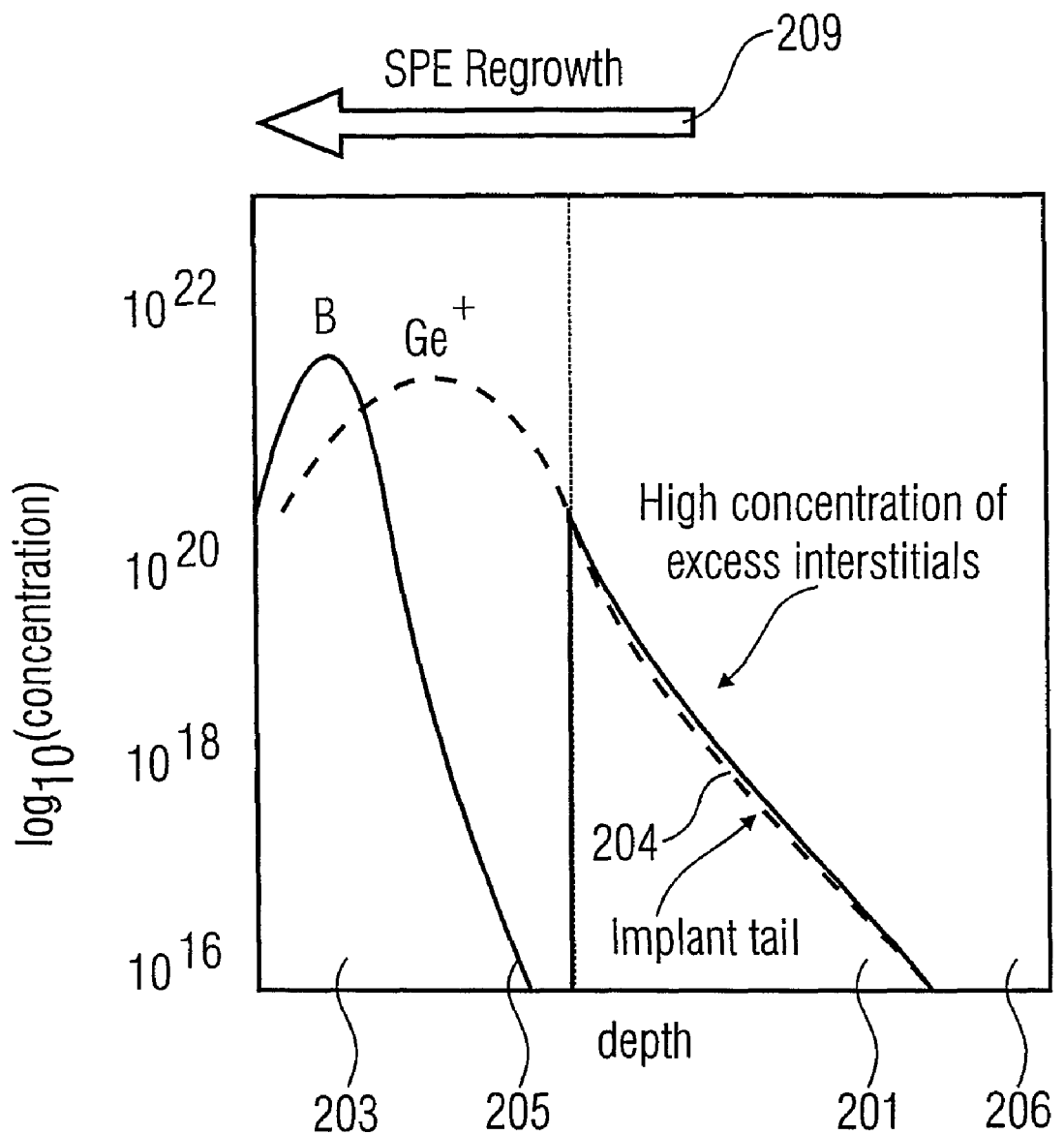
FIG. 4 shows implant damage from pre-amorphization, the boron (B) and germanium ($Ge^+$) doping concentration profiles and the direction of the solid-phase epitaxial regrowth (SPER)

FIG. 4 shows the ion concentration in a logarithmic representation in a silicon substrate, plotted along the y-axis of the diagram, the doping atom concentration depending on the depth into the substrate plotted along the x-axis of the diagram, wherein the main surface of the substrate is on the left-hand side of the diagram.

It is assumed that the surface region 203 of the diagram of the substrate has been pre-amorphized using germanium ions as implantation ions with a concentration profile as depicted in the diagram by a curve 204. It is furthermore assumed that after the pre-amorphization has been carried out, boron atoms were implanted into the substrate, for example, by means of introducing boron ions or introducing boron fluorine ions into the substrate. The respective concentration profile of the boron atoms is represented by the curve 205. As it is shown in FIG. 1, the Ge$^+$-ion implantation into the substrate has been carried out in such a way that after the implantation, both amorphized regions 203 and the crystalline left region 206 of the substrate contain germanium. During the implantation of the Ge$^+$-ions into the crystalline region 206 of the substrate, crystallographic lattice damages, also termed crystal lattice defects, are created. Such interstitial-type defects or interstitials 210 (see FIG. 5) are formed within the crystalline region 206 of the substrate as a result of the implantation of germanium ions.

A subsequent annealing process is usually carried out in order to enable a re-crystallization of a portion of the amorphized region 203 during a solid-phase epitaxial regrowth (SPER) process, as indicated by the arrow 209 in FIG. 4. In addition, some of the interstitials formed by the implanted damage are eliminated. However, not all of them are eliminated. Particularly, in a border region 208 at the interface between the amorphous region 203 and the crystalline region 206, so-called end-of-range interstitial type defects 210 remain. In other words, even after the SPER step, end-of-range interstitial damages still remain in the tail of the implant profile 201.

Figure 5:
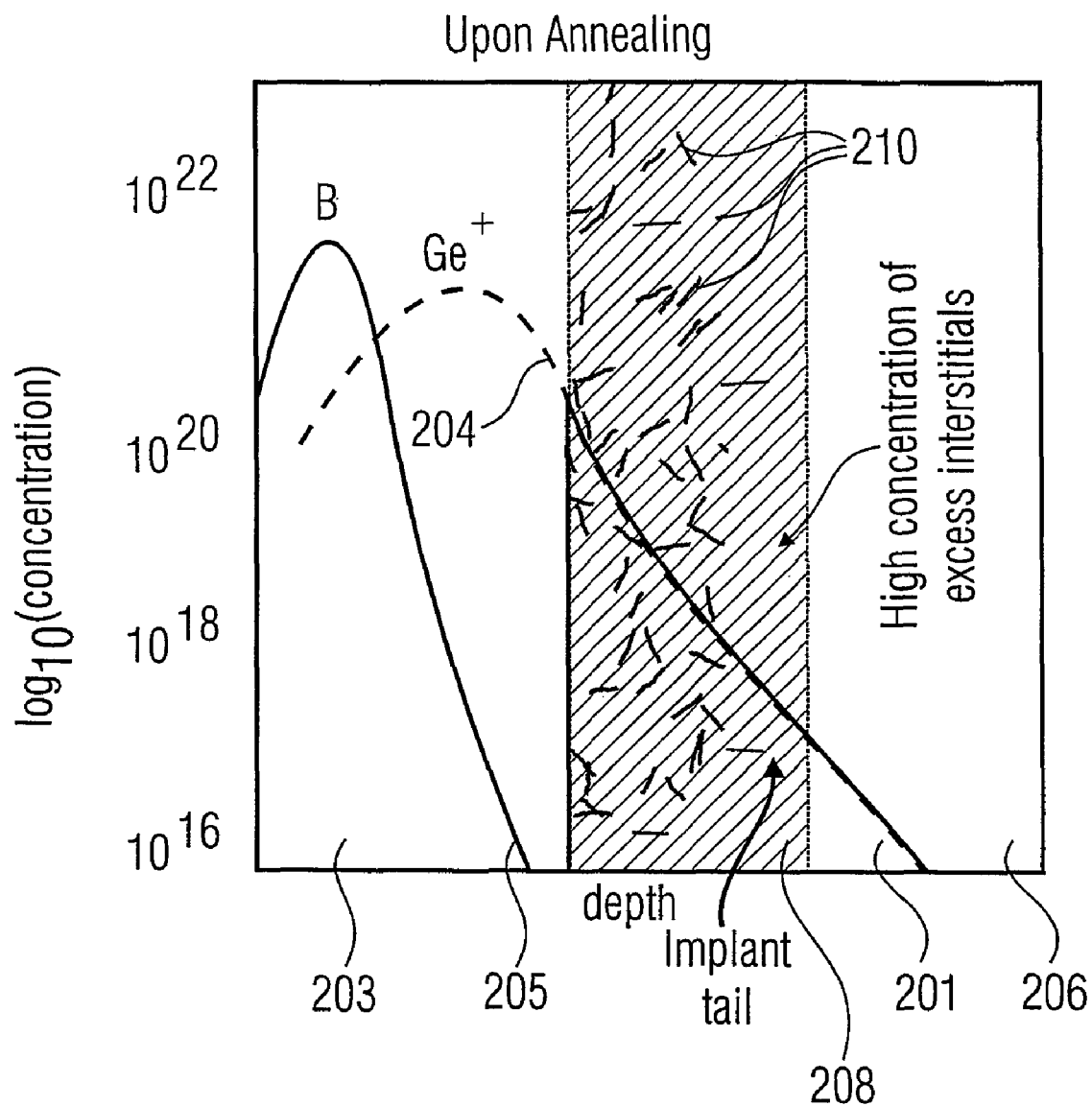
FIG. 5 shows the formation of interstitials as a result of the annealing.

FIG. 5 depicts a situation upon annealing. Upon annealing, the interstitials are condensed in the interstitial type defects 210, which may drive transient enhanced diffusion (TED) and doping atom deactivation.

The interstitial type defects 210 may cause transient enhanced diffusion of doping atoms, for example, in FIG. 5 boron atoms, and furthermore they are the cause for an undesirable deactivation of the doping atoms. Both the deactivation of the doping atoms and the TED are a consequence of one and the same mechanism, namely the super saturation of crystallographic lattice defects created by the implantation process. During the following solid-phase epitaxial regrowth, the crystallization process eliminates usually a part of the interstitials, but not all of them will be annealed. In particular the end-of-range defects will remain at the border between the amorphous region 203 and the crystalline region 206.

Furthermore, it has to be noted that the interstitial type defects 210 partly diffuse in the direction towards the main surface of the substrate (in FIG. 5, left-hand side).

As a substrate, a silicon substrate can be used, for example, a (100)-silicon substrate or a (111)-silicon substrate.

Figure 6A:
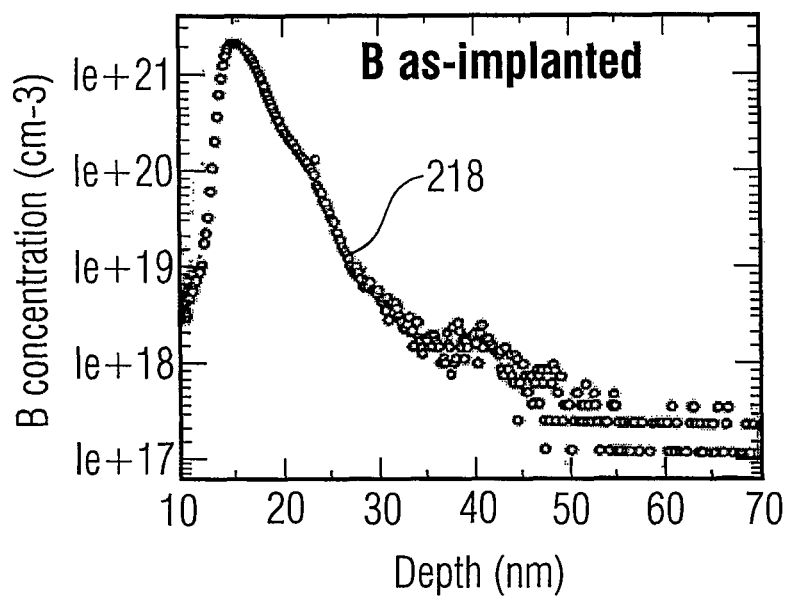
FIGS. 6a-6d show the measured boron doping profiles in a pre-amorphized silicon substrate for different annealing temperatures.
Figure 6B:
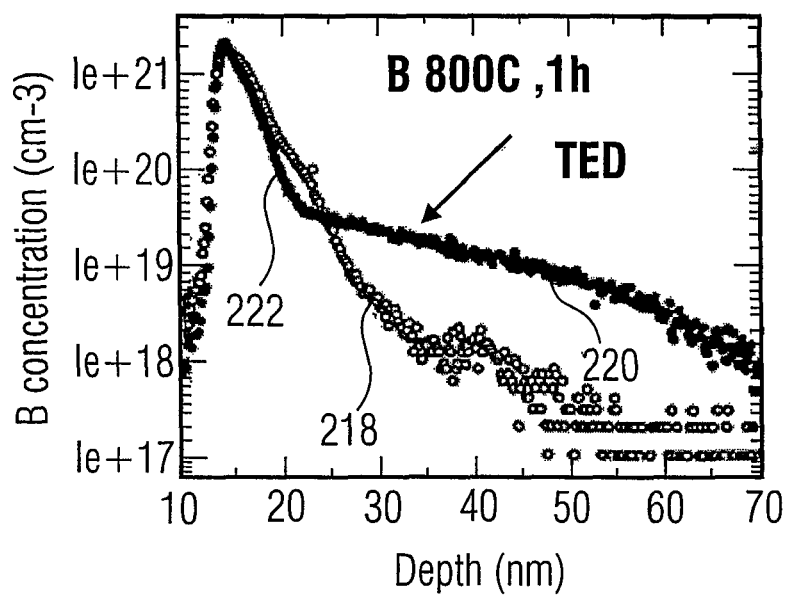

FIGS. 6*a* to 6*d* show a measured boron doping profile in a silicon substrate depending on the depth in the substrate for different annealing temperatures. The depicted boron doping concentration profiles are typical curves, as they are formed for producing ultra shallow junctions in certain semiconductor elements. FIG. 6*a* shows a boron doping concentration 218 as-implanted. For the further processing of the semiconductor element, it would be desirable that the doping profile would not change and would remain as-implanted. The doping profile within the substrate changes when applying a temperature of 800° C. for one hour 220 for the subsequent annealing process in order to perform the re-crystallization of the amorphous part of the substrate (see FIG. 6*b*). The mechanism, which leads to the shown change of the boron doping profile, is the so-called transient enhanced diffusion. The transient enhanced diffusion (TED) of the implanted doping atoms, in this case, boron, is normally caused by crystallographic defects. Compared to the as-implanted curve 218, curve 220 comprises another difference 222, which is caused by the above mentioned uphill diffusion.

Figure 6C:
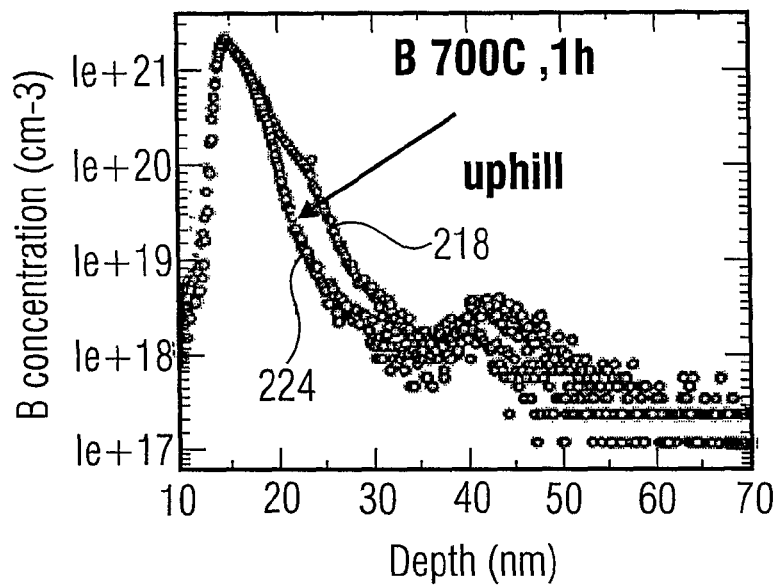

In contrast to the TED, the uphill diffusion can already be seen at an annealing temperature of 700° C. applied for one hour (see FIG. 6*c*). The uphill diffusion leads to a shift of the boron doping concentration towards the direction of the substrate surface, as can be seen by comparing curve 218, which shows the boron doping concentration as-implanted and curve 224 after uphill diffusion of the boron atoms.

Figure 6D:
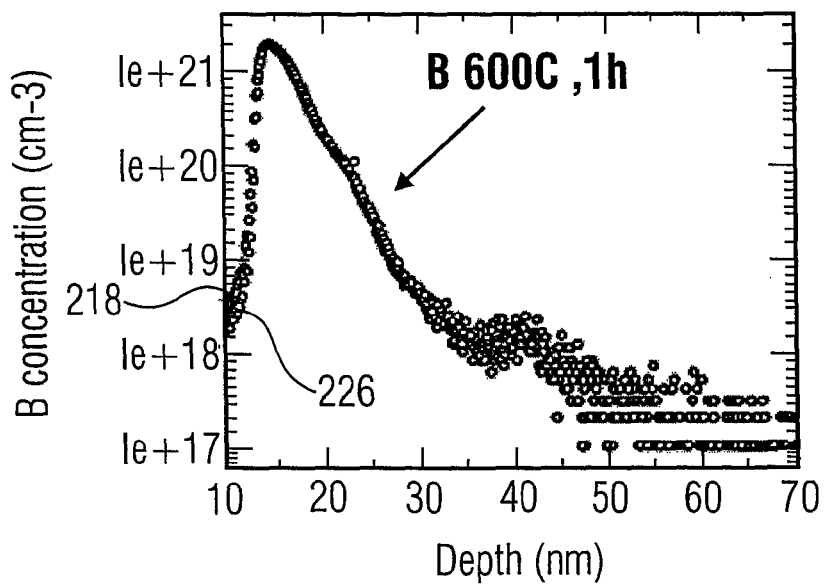

In FIG. 6*d* it is shown, that an optimized SPER thermal process at 600° C. for one hour leads to no change in the boron doping profile curve. The boron as-implanted curve 218 and the curve after annealing at 600° C. for one hour 226 are almost identical.

Figure 7A:
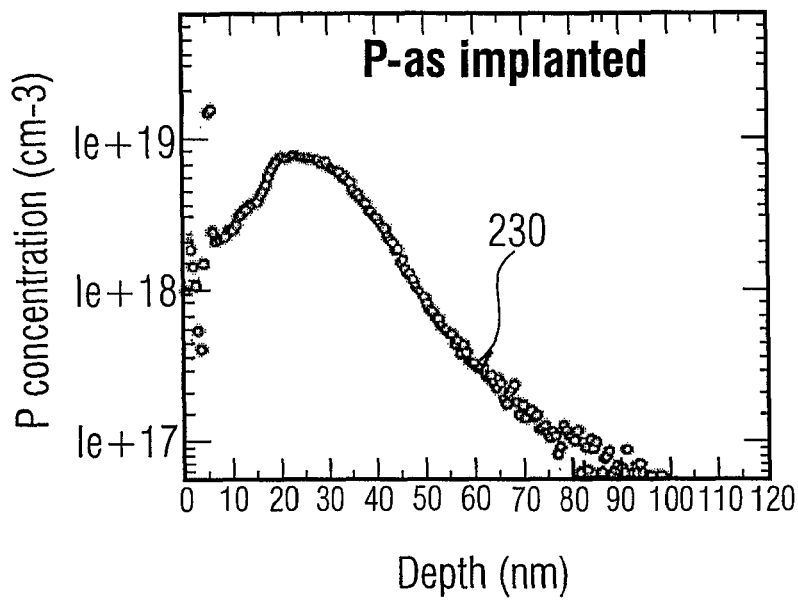
FIGS. 7a-7d show the measured phosphorus doping profiles in a pre-amorphized silicon substrate for different annealing temperatures.

As mentioned above, the doping of the substrate with doping atoms is not only restricted to boron atoms, but also to other n-type dopants such as phosphorus atoms. Accordingly, FIGS. 7*a* to 7*d* show measured phosphorous doping profiles depending on the depth of the substrate for different annealing temperatures. FIG. 7*a* shows the phosphorous doping profile as-implanted depending on the depth in the substrate.

Figure 7B:
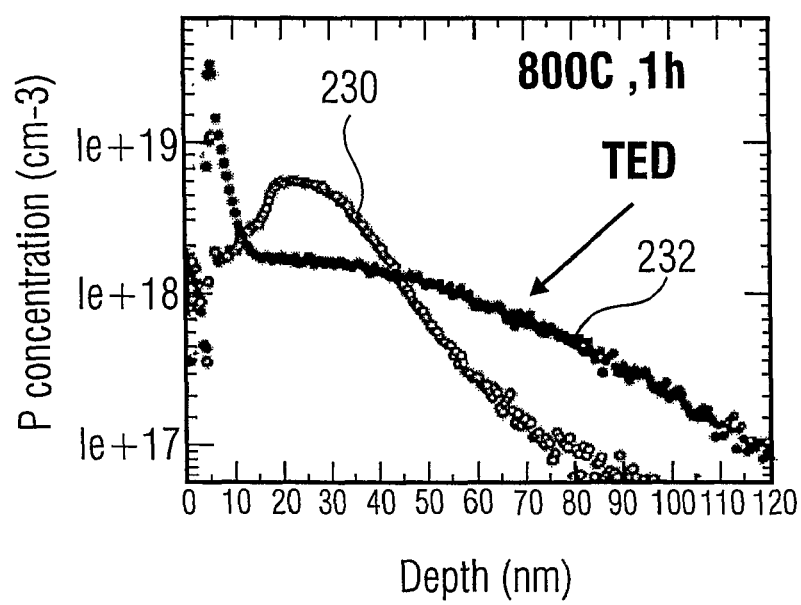

FIG. 7*b* shows the doping profile curve 230 for the phosphorous dopant as-implanted compared to the doping profile after annealing the substrate for one hour at 800° C. 232. The doping profile curve after annealing 232 comprises again a significant change compared to the curve 230, caused by the uphill diffusion and the TED.

Figure 7C:
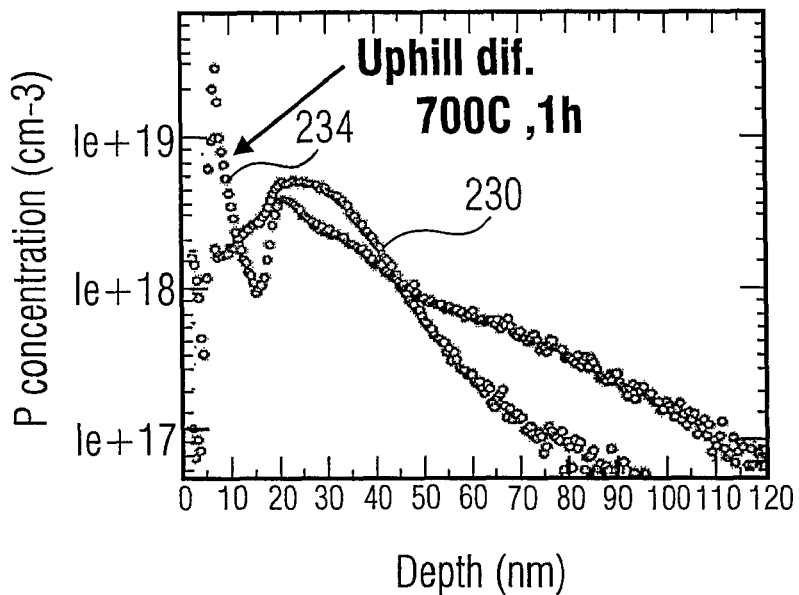

An annealing for one hour at 700° C. may give rise to a distinct uphill diffusion, as can be seen in FIG. 7*c* in a comparison of curve 234 with 230.

Figure 7D:
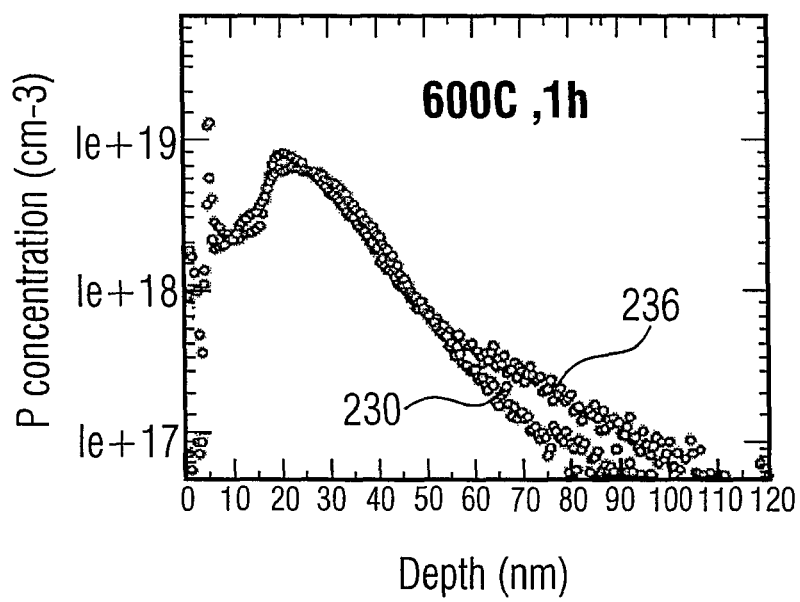

FIG. 7*d* depicts clearly, that annealing at 600° C. for one hour does not lead to any significant change in the phosphorus doping profile curve. The exact diffusion behavior of the respective doping atoms depends of course on the respective chemical and physical properties of the doping atoms. Therefore the doping of the substrate can be performed with different kinds of doping atoms.

In order to anneal the implantation damage caused by the amorphization implantation and/or by the doping implantation and in order to activate the doping atoms, normally a higher temperature step at a temperature higher than 1300° C. is often applied. This rapid thermal process can comprise laser heating or flash heating. One disadvantage of this method is the deactivation of the doping atoms during a subsequent low temperature annealing process. The deactivation of the doping atoms at low temperatures occurs on account of the formation of immobile doping atom interstitial clusters. The source of interstitials, which are needed for the formation of the doping atom interstitial clusters, are the above mentioned end-of-range defects.

Figure 8:
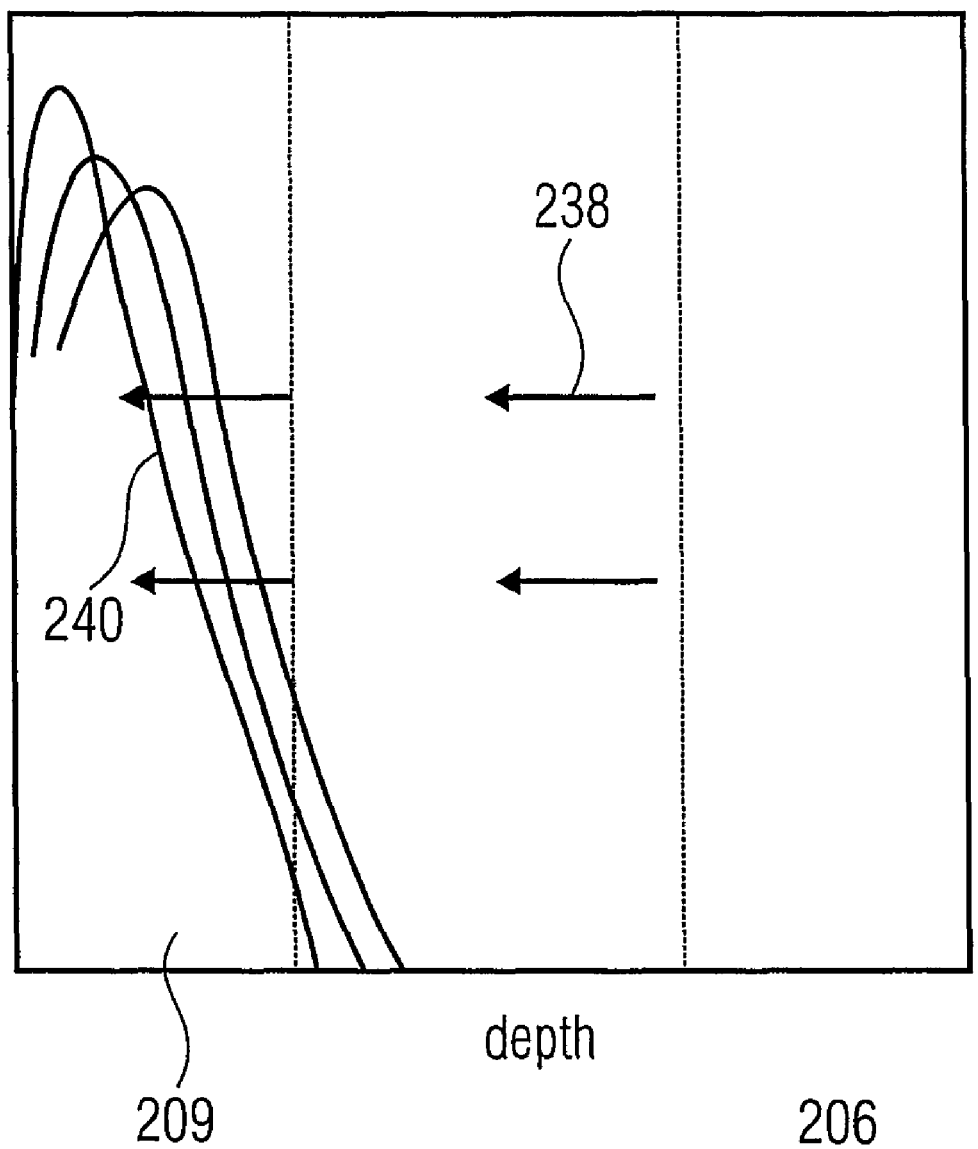
FIG. 8 shows in a diagram the previous understanding of uphill diffusion in a substrate.

FIG. 8 shows a diagram of the previous understanding of uphill diffusion. This previous understanding, for example, for boron atoms in silicon, was based on the assumption that during a solid-phase epitaxial regrowth annealing, boron is pushed out of the structure by the moving front of re-crystallization. The moving front of the solid-phase epitaxial regrowth is schematically depicted in FIG. 8 by arrows 238 and the respective shift of the boron doping profile curve 240 in the direction towards the assumed silicon substrate surface (on the left-hand side in FIG. 8).

Figure 9:
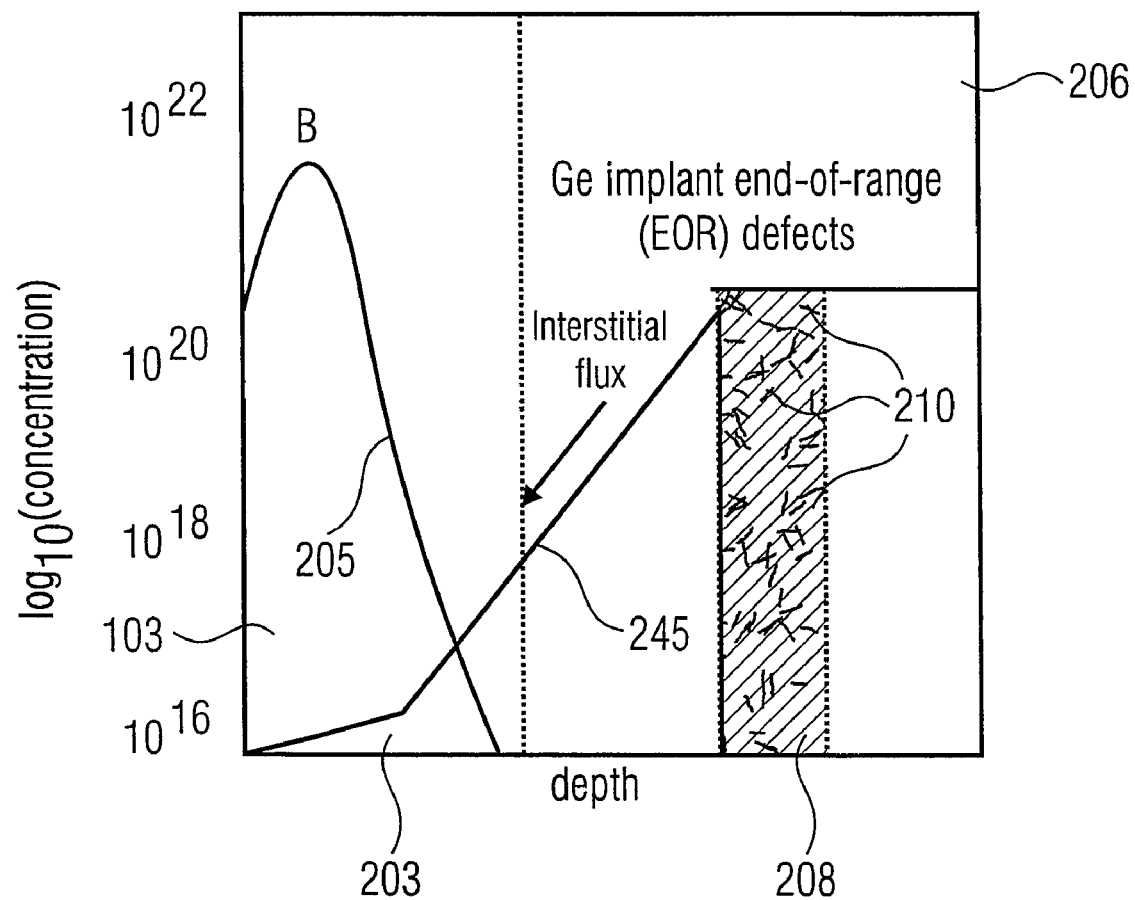
FIG. 9 shows a diagram with a new understanding of uphill diffusion in a substrate.

FIG. 9 shows a diagram of the new physical understanding of uphill diffusion, which is based on the finding that interstitials 210 emitted from the end-of-range defect band 208 are the source of the uphill diffusion. The interstitial type defects 210 partly diffuse in the direction towards the surface of the silicon substrate and, therefore, in the direction towards amorphous region 203. This interstitial type defect diffusion is depicted in FIG. 9, as interstitial flux 245. Since, interstitial flux is the root cause of the uphill diffusion of the doping atoms, for example, the boron atoms, a decrease of interstitial flux will reduce or even eliminate the uphill diffusion.

Figure 10:
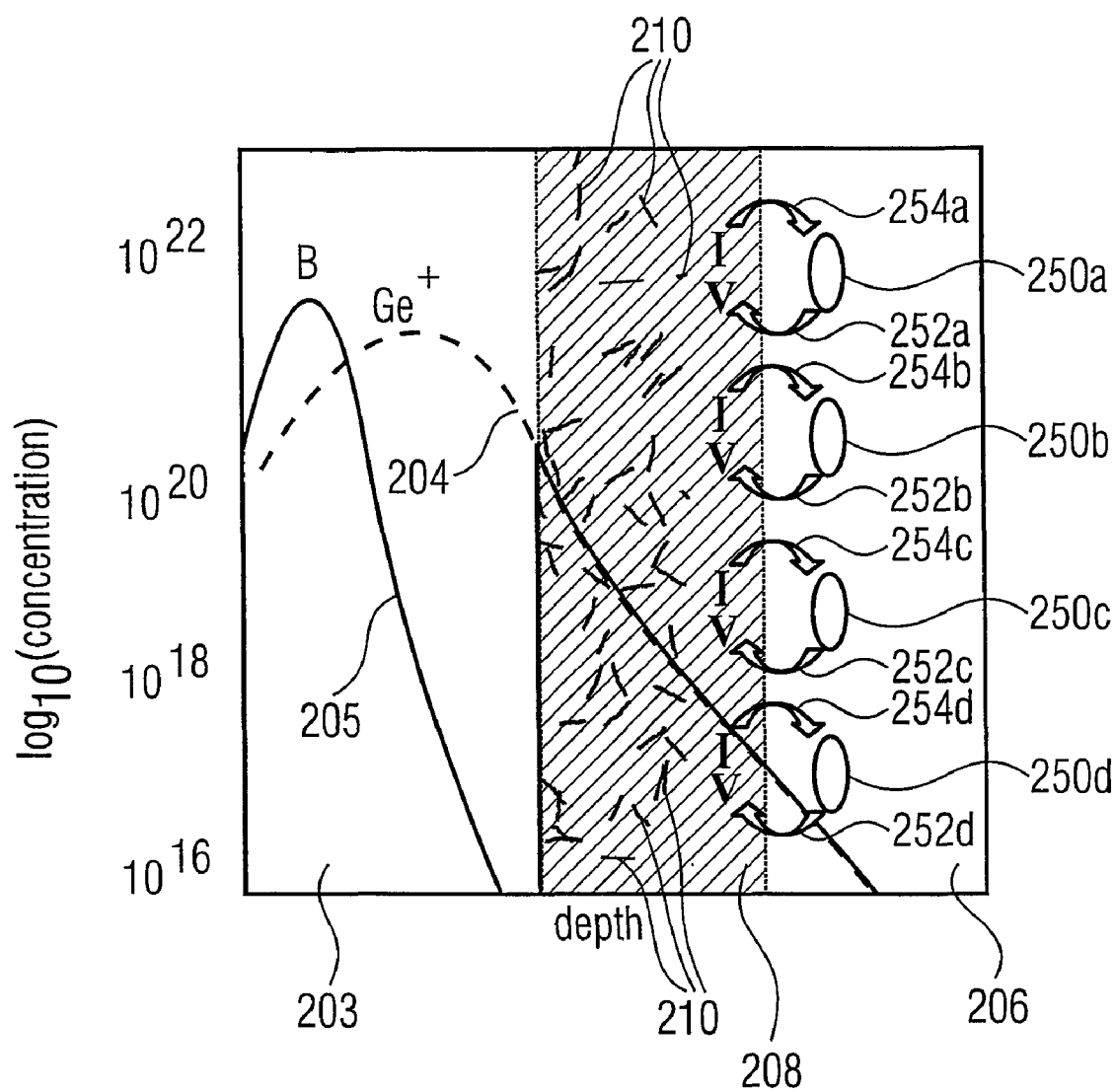
FIG. 10 shows a diagram depicting the elimination of the uphill diffusion during annealing by introducing micro-cavities.

According to one embodiment of the invention, FIG. 10 gives an overall view of the boron doping profile 205, the germanium profile 204, the amorphous silicon region 203, the crystalline silicon region 206, the end-of-range defect zone 208, the interstitials 210 and the micro-cavities 250a-250d. As it is shown in FIG. 4, the micro-cavities 250a-250d are formed within local proximity of the interstitials 210, or rather the end-of-range defect zone 208 to be expected and being formed later, wherein the micro-cavities 250a-250d are formed so close to the later-formed interstitials 210, or rather the end-of-range defect zone 208 so as to serve as sinks for the interstitials 210. In other words, the interstitial type defects 210 are dissolved by means of the micro-cavities 250a-250d. This process is symbolized by arrows 252a-252d and 254a-254d. The micro-cavities 250a-250d form a source of vacancies, depicted by the arrows 252a-252d, which serve as sinks for the interstitials, which is represented by the arrow 254a-254d.

The elimination process can be carried out as a temperature supported process using a rapid thermal anneal (RTA). Thus, a very simple standard mechanism can be used for eliminating at least partially the undesired interstitial type defects 210. The micro-cavities 250a-250d form a kind of artificial surface region within the substrate, which is known to act as a sink for interstitials. End-of-range defects are rather interstitial type defects, which comprise a high instability close to the surface of a substrate, which is why the micro-cavities with the artificial surface within the substrate act as sinks for the interstitial type defects.

Figure 11:
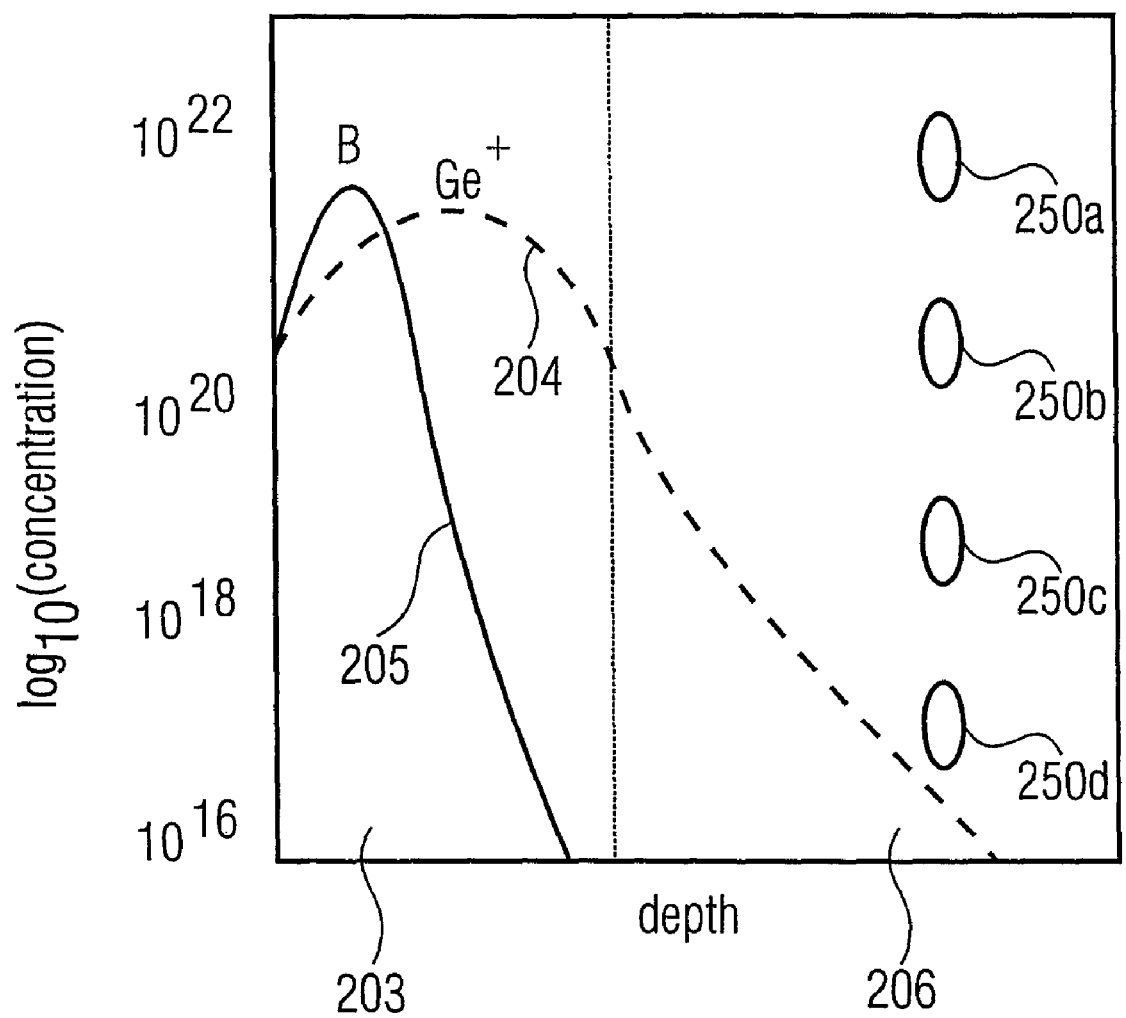
FIG. 11 shows schematically the final condition of the substrate after eliminating the interstitials.

FIG. 11 shows the symbolic final condition of the substrate after eliminating the interstital typed defects 210, whereas it is assumed, that the micro-cavities 250a-250d after the elimination of the interstitial type defects still remain in the substrate. The boron 205 and the germanium ions 204 doping profile, the amorphized zone 203 and the crystalline zone 206 can still be seen, since the SPER is not performed in the FIG. 11.

A semiconductor element produced in a substrate according to the inventive method can, for example, at least comprise one shallow junction in the substrate, wherein the shallow junction comprises doping atoms. Beneath the shallow junction, the above-mentioned micro-cavities are formed in the substrate. The process sequences of producing a semiconductor element in a substrate can be integrated into a conventional complementary metal oxide semiconductor (CMOS) process. As doping atoms, different types of doping atoms can be used on principle, for example, boron atoms, phosphorus atoms or arsenic atoms. Furthermore, in addition, or as an alternative, fluorine atoms or carbon atoms may be used. These doping atoms can be, for example, implanted into the substrate or it is also feasible that the doping is performed in another way used in semiconductor processing.

At least one region of the semiconductor element, in which region the doping atoms are implanted into the substrate, forms a shallow junction or an ultra shallow junction of the semiconductor element. The semiconductor element can be formed as a transistor, for example, as a field-effect transistor (FET).

In accordance with this embodiment of the invention, at least one region, within which region the doping atoms are implanted in the substrate, may form a source region or a drain region of the field-effect transistor. Thus, a first region in which the doping atoms are implanted into the substrate may be formed as a source region of the field-effect transistor and a second region, within which the doping atoms are implanted into the substrate, may be formed as a drain region of the field-effect transistor. The substrate may be a silicon substrate, for example, a (100)-silicon substrate or a (111)-silicon substrate.

It is feasible that in the context of the fabrication of a field-effect transistor after forming the micro-cavities, a gate isolation or, rather a gate dielectric, can be formed, for example, a gate oxide layer on top of the channel region of the field-effect transistor. However, it is also feasible that the gate dielectric is formed first and the micro-cavities afterwards. In this case, the gate dielectric can act as a mask and even after forming the micro-cavities by implanting ions, the region beneath the gate dielectric remain free of micro-cavities.

Figure 12A:
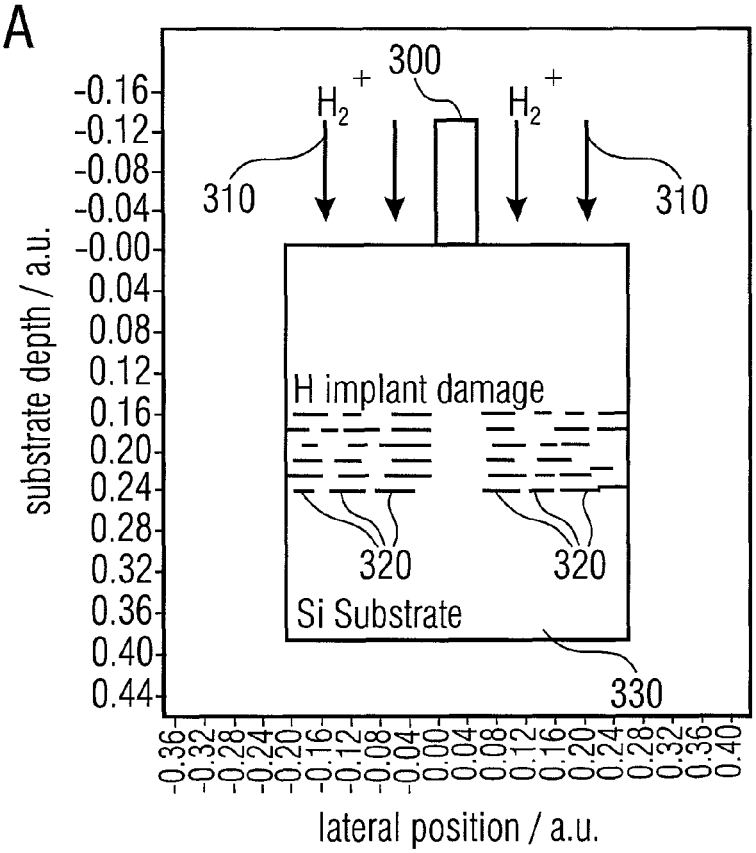
FIG. 12a shows as another embodiment of the method for producing a semiconductor element a first state of producing a FET with a gate oxide deposited before forming the micro-cavities.
Figure 12B:
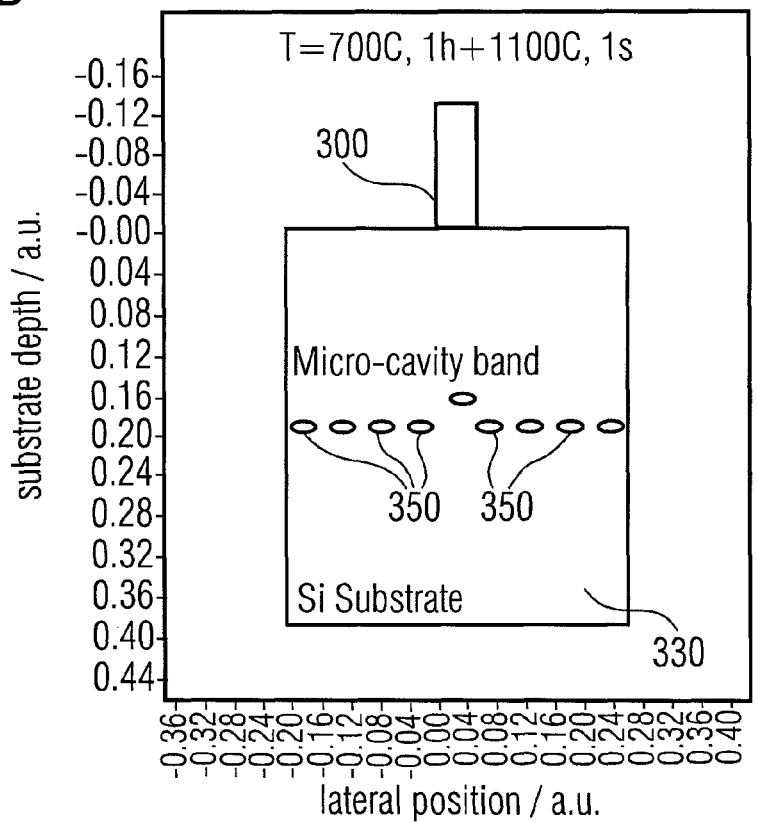
FIG. 12b shows a further state at the production of a FET.

FIG. 12a depicts in a diagram, with a y-axis showing the substrate depth and a x-axis showing the lateral position in the substrate, a substrate with small micro-cavities, formed as small plates 320, whereas a gate structure 300 was formed before the micro-cavities have been formed and therewith prior to $H_2^+$-ions implantation 310. The $H_2^+$-ions 310 are implanted with an implantation dose $\Phi=2\times10^{16}$ cm$^{-2}$ and with an implantation energy E=20 keV, or alternative with an implantation dose $\Phi=1.3\times10^{16}$ cm$^{-2}$ and an implantation energy E=120 keV. The gate structure 300 is formed in a conventional process step, by oxidizing the surface of the silicon substrate 330 and depositing poly-silicon. By means of structuring the poly-silicon layer and the silicon oxide layer the gate structure with a gate oxide and a gate electrode is formed. The region beneath the gate structure 300 remains even after the $H_2^+$-ions implantation free of $H_2^+$-ions, since the gate structure 300 acts as a kind of mask during the $H_2^+$-ions implantation. FIG. 12b shows the semiconductor element after annealing it for 1 h at T=700° C. in order to diffuse out the $H_2^+$-ions and, for example, forming bigger micro-cavities 350 by annealing the small plates 320 for 1 s at 1100° C.

Figure 12C:
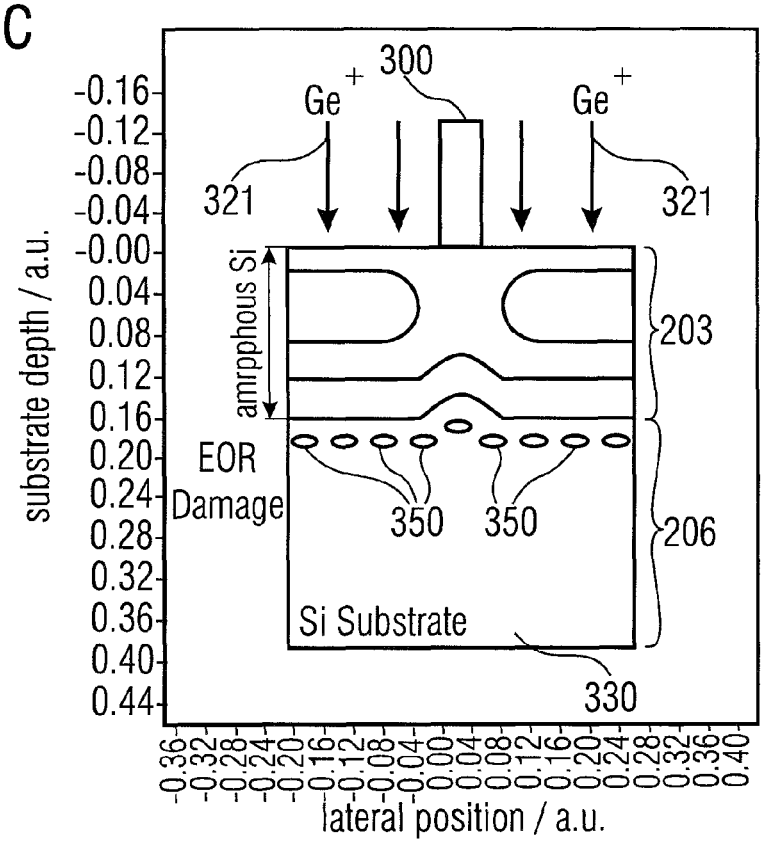
FIG. 12c shows a further state at the production of a FET.

In FIG. 12c, the shown structure, will be amorphized in the surface region down to a depth from approximately 50 nm to 200 nm, for example, down to a depth of approximately 100 nm, by implanting Ge$^+$-ions 321 so that the anciently crystalline (100)-silicon substrate 330 comprises an amorphous region 203 which extends approximately to the micro-cavities 350 and a crystalline region 206. The approximate distance between the micro-cavities 350 and the lower border of the amorphous region 203 is about 10 nm and 20 nm. In this embodiment of the invention the Ge$^+$-ions 321 are implanted with an implantation energy of E=120 keV and an implantation dose of $\Phi=10^{15}$ cm$^{-2}$.

Figure 12D:
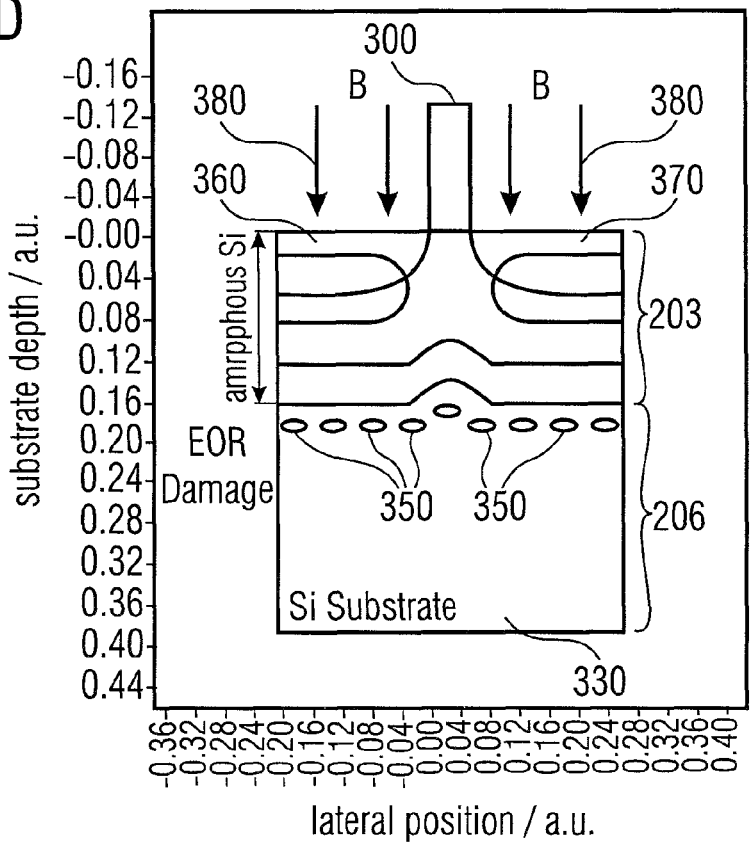
FIG. 12d shows a FET produced with the method of producing a semiconductor element.

In FIG. 12d, a source region 360 and a drain region 370 is formed by using the gate structure 300 as a mask for the subsequent boron implantation 380 in the amorphous region 203 (see FIG. 12d). Thus, a field-effect-transistor (FET) is formed comprising less interstitials than usually fabricated FET's. Additional the TED is reduced in the FET as explained above.

In FIG. 12a-12d the $H_2^+$-ions implantation and the heating to form micro-cavities out of small plates is performed before the amorphization of the substrate 330.

FIG. 13a-13d show in another embodiment of the present invention a further process to produce a FET. Contrary to FIG. 12a-12d the gate structure 300 is formed after forming the micro-cavities 350, whereas the method of performing the individual steps is identical with the embodiment of the present invention of FIG. 12a-12d, that is why the individual steps are not detailed described again.

Figure 13A:
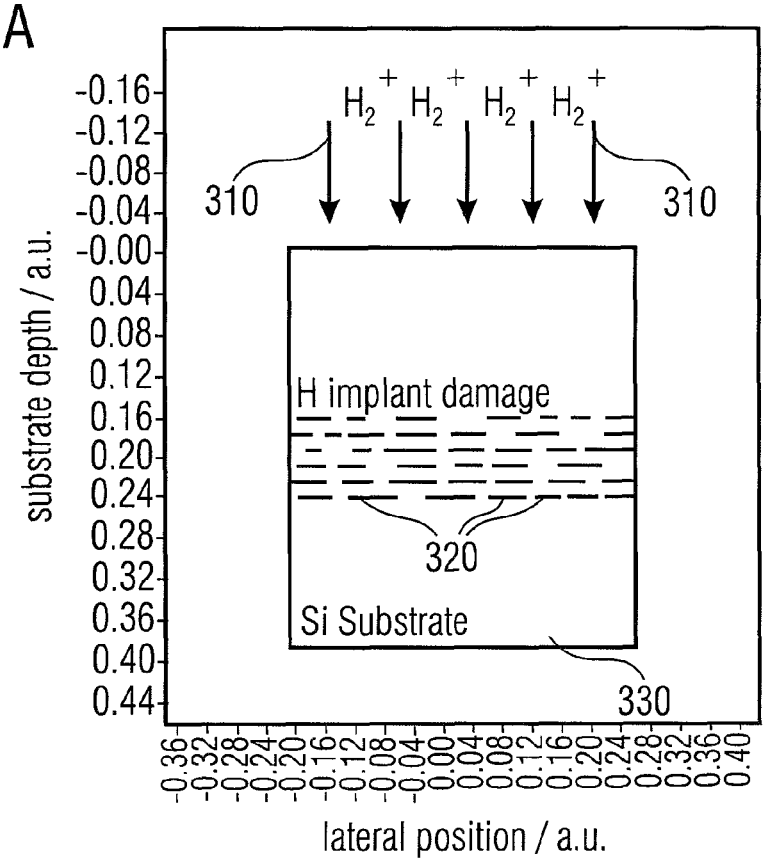
FIG. 13a shows another embodiment of the method for producing a semiconductor element a first state of producing a FET with micro-cavities formed before depositing a gate-oxide.

As it is shown in FIG. 13a, the $H_2^+$-ions are implanted in the substrate such that the micro-cavities are formed, for example, as small plates 320. Since there is no gate structure 300 during the $H_2^+$-ions implantation a continuous structure of micro-cavities, for example, in the form of small plates 320 is formed in the substrate.

Figure 13B:
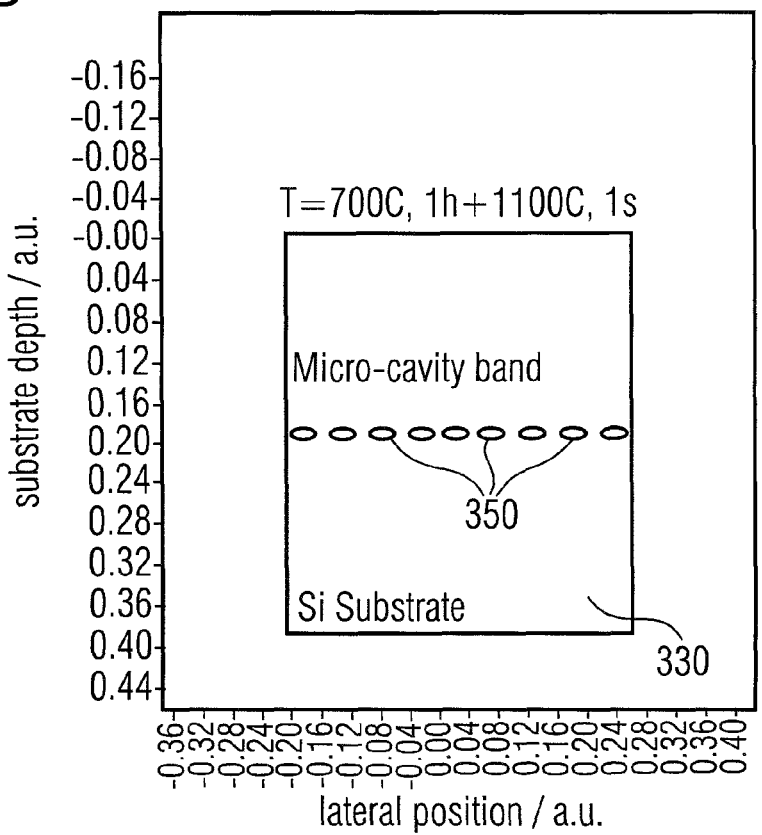
FIG. 13b shows a further state at the production of a FET.

According to the above mentioned method, again bigger micro-cavities 350 can be formed as shown in FIG. 13b.

Figure 13C:
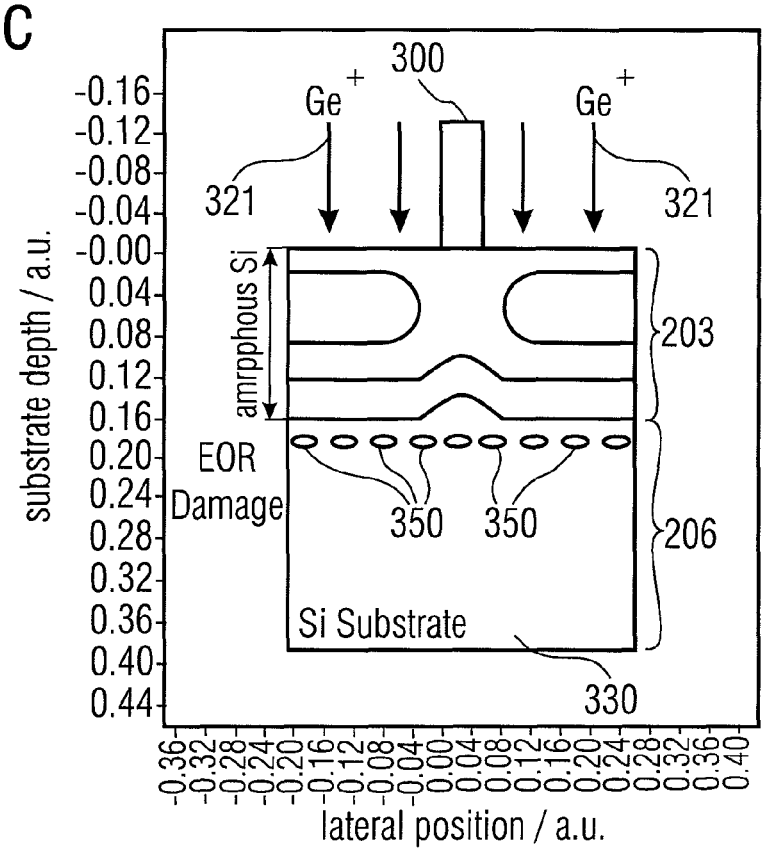
FIG. 13c shows a further state at the production of a FET.

Afterwards the gate structure 300 can be formed, for example, according to the method described in conjunction with FIG. 12a and as shown in FIG. 13c.

Figure 13D:
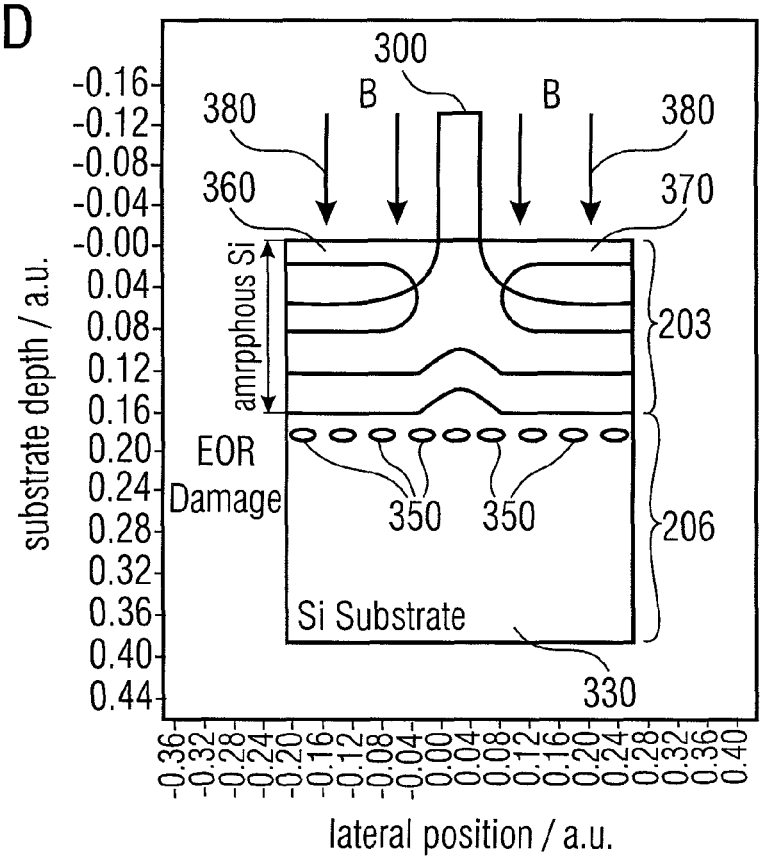
FIG. 13d shows a FET produced with the method of producing a semiconductor element.

In FIG. 13d, the gate structure 300 forms a mask for the subsequent boron implantation 380 in the amorphous region 203 to establish a source region 360 and a respective drain region 370, so that the field-effect-transistor is completed.

Thus, a field-effect-transistor (FET) is formed comprising less interstitials than usually fabricated FET's. Additional the TED is reduced in the FET as explained above.

As already mentioned, by forming the micro-cavities, which act as sinks for interstitial type defects, the transient enhanced diffusion and also the doping atom deactivation will be reduced or eliminated. For this reason high temperature processes are not needed anymore. This offers a plurality of possibilities to choose a suitable rapid thermal process.

The size of the micro-cavities in the substrate can be tuned by the exact implantation and annealing conditions. Generally the length and the width of the micro-cavities may be in the order of, for example, 10 nm and the height of the micro-cavities may be in the order of 0.54 nm. By means of the implantation dose and/or the implantation energy, the depth and the extension of the region in which the micro-cavities are formed in the substrate can be influenced. For example, the ions can be implanted within an energy between 10 keV and 150 keV and within an implantation dose of approximately $10^{15}$ cm$^{-2}$ and $10^{18}$ cm$^{-2}$. Furthermore, the annealing may lead to a diffusion of the implanted pre-amorphization ions in the form of neutral atoms or, rather molecules. For example, in the case of the implanted $H_2^+$-ions, $H_2$ molecules might be formed by annealing.

To date, the uphill diffusion of doping atoms, for example, boron atoms has been treated as an inherent drawback of the SPER process. Therefore, one of the most important aspects of the invention is to effectively suppress uphill diffusion during low temperature processing and to ensure that the uphill diffusion does not occur during further thermal processing. Uphill diffusion is not inherent to the SPER process and under certain conditions as described above, can be completely suppressed. It has clearly been identified that the physical process leading to uphill diffusion is the migration of self-interstitials from the end-of-range regions to the surface of the substrate. Since, for example, boron mainly diffuses by pairing with interstitials, a large flux of interstitials towards a surface will enable the boron atoms located at the tail of the concentration to diffuse against the gradient of boron concentration. The importance of suppressing uphill diffusion and, as a direct consequence, boron loss by deactivation, is quite high, since it eliminates an element of instability to the process, which is particularly important when technology transfer is considered. For example, by reducing the boron loss, the high boron implanted process currently used for creating the highly doped p+/n ultra shallow junctions could be strongly reduced and as a direct consequence, a considerable throughput increase. In particular, when low energy implants, for example, for boron 0.5 keV, are needed, high current beams are usually not easily achieved and therefore, a reduction of a factor of 10 in the dose will have a considerable impact on the overall implantation time.

Uphill diffusion is suppressed during further temperature processes, for example, during the nitride's basic construction or RTP processes by suppressing the interstitial migration towards the surface of the substrate. The flux of interstitials towards the surface is eliminated by introduction of a high number of sinks for interstitials in the region of high interstitial concentration by means of micro-cavity engineering. The same behavior can, for example, be used to suppress phosphorus uphill diffusion. The micro-cavities and an optimized SPER thermal process, which are integrated into the process flow before TEOS and nitride spacer construction is needed to ensure that doping atom profile is implanted, for example, the boron profile remains immobile. Both uphill and normal diffusion are prevented by using a process temperature lower than 600° C.

In order to avoid doping atoms segregation, for example, boron segregation, the substrate air interface or, for example, at a silicon/silicon dioxide interface, a thin amorphous layer is deposited at low temperatures (T<500° C.), for example, at T=450° C. The thin amorphous layer maintains an integral doping atom dose unchanged by avoiding low temperature doping atom segregation or accumulation at the interface.

What is claimed is:

1. A method of producing an integrated circuit, the method comprising:
    forming a plurality of micro-cavities in a substrate;
    creating an amorphization of the substrate to form crystallographic defects and a doping of the substrate with doping atoms;
    depositing an amorphous layer over the substrate; and
    annealing the substrate, such that at least a part of the crystallographic defects is eliminated using the micro-cavities;
    wherein a semiconductor element is formed using the doping atoms.

2. The method according to claim 1, wherein forming the plurality of micro-cavities comprises implanting ions into the substrate.

3. The method according to claim 2, wherein implanting ions comprises implanting $H_2^+$-, $He^+$-, $F^+$-, $Ne^+$-, $Cl^+$-, or $Ar^+$-ions.

4. The method according to claim 2, wherein implanting ions comprises using an implantation dose of between approximately $10^{15}$ cm$^{-2}$ and $10^{18}$ cm$^{-2}$.

5. The method according to claim 2, wherein implanting ions comprises implanting with an energy between 10 keV and 150 keV.

6. The method according to claim 1, wherein annealing comprises annealing at a temperature lower than 650° C.

7. The method according to claim 1, wherein creating the amorphization comprises amorphizing the substrate down to a depth lower than 500 nm.

8. The method according to claim 1, wherein creating the amorphization of the substrate comprises using amorphization ions.

9. The method according to claim 8, wherein the amorphization ions comprise germanium ions and/or silicon ions.

10. The method according to claim 1, wherein the micro-cavities are near an interface between a crystalline region of the substrate and an amorphous region of the substrate formed by the amorphization of the substrate.

11. The method according to claim 1, wherein creating the amorphization of the substrate to form a doping of the substrate comprises implanting one or more of boron atoms, phosphorus atoms, or arsenic atoms into the substrate.

12. The method according to claim 11, wherein implanting comprises introducing boron ions into the substrate or introducing boron fluoride ions into the substrate or introducing boron clusters into the substrate.

13. The method according to claim 1, wherein at least one region, within which region the doping atoms are implanted into the substrate, forms a shallow junction of the semiconductor element.

14. The method according to claim 13, wherein the semiconductor element comprises a transistor.

15. The method according to claim 14, wherein the semiconductor element comprises a field effect transistor.

16. The method according to claim 15, wherein the at least one region, within which region the doping atoms are implanted into the substrate, forms a source region or a drain region of the field effect transistor.

17. The method according to claim 16,
wherein a first region, within which the doping atoms are implanted into the substrate, forms a source region of the field effect transistor; and
wherein a second region, within which the doping atoms are implanted into the substrate, forms a drain region of the field effect transistor.

18. The method according to claim 1, wherein the substrate comprises a silicon substrate.

19. The method according to claim 18, wherein the substrate is a (100) silicon substrate or a (111) silicon substrate.

20. The method according to claim 1, wherein depositing an amorphous layer comprises depositing at a temperature lower than 500° C.

21. The method according to claim 1, wherein depositing an amorphous layer comprises depositing silicon.

22. The method according to claim 1, wherein depositing an amorphous layer comprises depositing the amorphous layer to a thickness between 5 nm and 100 nm.

23. The method according to claim 1, further comprising performing a TEOS and a nitride spacer deposition after the annealing.

24. The method according to claim 1, wherein creating an amorphization comprises forming a buried crystallographic defect layer near a region of the plurality of micro-cavities.

25. A method of producing an integrated circuit, the method comprising:
forming a plurality of micro-cavities in a substrate;
creating an amorphization of the substrate to form crystallographic defects and a doping of the substrate with doping atoms; and
depositing an amorphous layer over the substrate;
annealing the substrate at a temperature lower than 600° C., such that at least a part of the crystallographic defects is eliminated using the micro-cavities;
wherein a semiconductor element is formed using the doping atoms.

26. The method according to claim 25, wherein forming the plurality of micro-cavities comprises implanting ions into the substrate.

27. The method according to claim 25, wherein creating the amorphization of the substrate is performed such that the substrate is amorphized down to a depth lower than 500 nm.

28. The method according to claim 25, wherein creating the amorphization of the substrate comprises using amorphization ions.

29. The method according to claim 28, wherein the amorphization ions comprise germanium ions and/or silicon ions.

30. The method according to claim 25, wherein creating the amorphization of the substrate to form the doping of the substrate comprises implanting one of boron atoms, phosphorous atoms, or arsenic atoms into the substrate.

31. The method according to claim 25, wherein the implanting comprises introducing boron ions into the substrate or introducing boron fluoride ions into the substrate or introducing boron clusters into the substrate.

32. The method according to claim 25, wherein at least one region, within which region the doping atoms are implanted into the substrate, forms a shallow junction of the semiconductor element.

33. The method according to claim 25, wherein the semiconductor element comprises a transistor.

34. The method according to claim 33, wherein the semiconductor element comprises a field effect transistor.

35. The method according to claim 34, wherein at least one region, within which region the doping atoms are implanted into the substrate, forms a source region or a drain region of the field effect transistor.

36. The method according to claim 35,
wherein a first region, within which the doping atoms are implanted into the substrate, forms a source region of the field effect transistor; and
wherein a second region, within which the doping atoms are implanted into the substrate, forms a drain region of the field effect transistor.

37. The method according to claim 25, wherein the substrate is a silicon substrate.

38. The method according to claim 25, further comprising depositing a TEOS and a nitride spacer after the annealing.

39. The method according to claim 25, wherein the amorphization is performed such that a buried crystallographic defect layer near a region of the plurality of micro-cavities is formed.

40. The method according to claim 1, wherein depositing an amorphous layer on top of the substrate is performed after creating the amorphization to form crystallographic defects and the doping of the substrate with doping atoms.

41. The method according to claim 1, wherein depositing of an amorphous layer on top of the substrate is performed at a surface of the substrate being used for creating the amorphization of the substrate and the doping of the substrate with doping atoms.

42. The method according to claim 25, wherein annealing the substrate is performed at a temperature lower than 580° C.

43. The method according to claim 25, wherein after creating an amorphization and a doping of the substrate with doping atoms, a rapid thermal process (RTP), a laser annealing or a flash annealing of the substrate to produce the semiconductor element is performed.

44. The method according to claim 25, wherein the annealing is a solid-phase epitaxial regrowth (SPER) which is performed to eliminate at least a part of the crystallographic defects by means of the micro-cavities.

* * * * *